United States Patent
Sasaki et al.

(10) Patent No.: US 7,288,151 B2
(45) Date of Patent: Oct. 30, 2007

(54) METHOD OF MANUFACTURING GROUP-III NITRIDE CRYSTAL

(75) Inventors: Takatomo Sasaki, Suita (JP); Yusuke Mori, 8-16-9, Kisaichi, Katano-shi, Osaka (JP); Masashi Yoshimura, Takarazuka (JP); Fumio Kawamura, Minoh (JP); Ryu Hirota, Itami (JP)

(73) Assignees: Sumitomo Electric Industries, Ltd., Osaka-shi (JP); Yusuke Mori, Katano-shi (JP)

( * ) Notice: Subject to any disclaimer, the term of this patent is extended or adjusted under 35 U.S.C. 154(b) by 361 days.

(21) Appl. No.: 10/999,338

(22) Filed: Nov. 29, 2004

(65) Prior Publication Data

US 2005/0153471 A1   Jul. 14, 2005

(30) Foreign Application Priority Data

Jan. 8, 2004   (JP)   ............ 2004-003260

(51) Int. Cl.
*C30B 11/14*   (2006.01)

(52) U.S. Cl. ............ 117/78; 117/81; 117/82; 117/83

(58) Field of Classification Search ......... 117/82, 117/83, 81, 78
See application file for complete search history.

(56) References Cited

U.S. PATENT DOCUMENTS 5,868,837 A   2/1999   DiSalvo et al.

7,097,707 B2 *   8/2006   Xu ............... 117/13

FOREIGN PATENT DOCUMENTS

| JP | 11-060394 | 3/1999 |
|----|-----------|--------|
| JP | 11-189498 | 7/1999 |
| JP | 2000-049378 | 2/2000 |
| JP | 2001-058900 | 3/2001 |
| JP | 2001-064097 | 3/2001 |
| JP | 2001-064098 | 3/2001 |
| JP | 2001-077038 | 3/2001 |
| JP | 2001-102316 | 4/2001 |
| JP | 2001-338887 | 12/2001 |
| JP | 2002-201100 | 7/2002 |

* cited by examiner

*Primary Examiner*—Robert Kunemund
(74) *Attorney, Agent, or Firm*—W. F. Fasse; W. G. Fasse

(57) ABSTRACT

There is provided a method of manufacturing a group-III nitride crystal in which a nitrogen plasma is brought into contact with a melt containing a group-III element and an alkali metal to grow the group-III nitride crystal. Furthermore, there is also provided a method of manufacturing a group-III nitride crystal in which the group-III nitride crystal is grown on a substrate placed in a melt containing a group-III element and an alkali metal, with a minimal distance between a surface of the melt and a surface of the substrate set to be at most 50 mm.

9 Claims, 3 Drawing Sheets

METHOD OF MANUFACTURING GROUP-III NITRIDE CRYSTAL

BACKGROUND OF THE INVENTION

1. Field of the Invention

The present invention relates to a method of manufacturing a group-III nitride crystal, and in particular to a method of manufacturing a group-III nitride crystal with the growth rate thereof increased.

2. Description of the Background Art

As is well known in the art in recent years, there has been an increased demand for a gallium nitride (GaN) crystal or any other similar group-III nitride crystal to use, for example, in a semiconductor laser and a semiconductor light emitting diode for emitting blue light or ultraviolet light.

As a conventional method of manufacturing a group-III nitride crystal, there is known a hydride vapor deposition method, an organic metal vapor deposition method, a chemical transport method, or the like.

In the hydride vapor deposition method and the organic metal vapor deposition method, however, a source gas is introduced into a reaction chamber for a reaction, in which hydrogen chloride (HCl), ammonia ($NH_3$), hydrogen ($H_2$) or the like is not incorporated into a group-III nitride crystal as its component, remains in the reaction chamber, and is required to be evacuated therefrom. Therefore, in these methods, most of the source gas is disposed without contributing to the growth of a group-III nitride crystal, which causes lower material yields. Furthermore, disposing a large amount of gas such as HCl, $NH_3$ or $H_2$ requires large facilities to eliminate toxicity thereof, which also causes higher cost of production facilities.

In contrast, in the chemical transport method in which a source gas vaporized in a high-temperature portion of a closed reaction pipe is transported to a low-temperature portion thereof to grow a crystal there, the gas is not evacuated from the pipe, providing favorable material yields. In this method, however, a source gas is not supplied from outside. Therefore, an amount of the source gas to be transported cannot be increased, making it difficult to increase the growth rate of a group-III nitride crystal.

Furthermore, U.S. Pat. No. 5,868,837, Japanese Patent Laying-Open Nos. 2001-58900, 2001-64097, 2001-64098, 2001-102316, and 2002-201100 disclose a method of growing a GaN crystal by means of a flux method in which sodium (Na) or the like is used as a flux. However, in the method disclosed in the patent literature above, a high-pressure container is required to cope with the low growth rate of a GaN crystal, which also causes higher cost of manufacturing the same. In addition, the method suffers from difficulty in controlling electrical conduction of the GaN crystal.

SUMMARY OF THE INVENTION

An object of the present invention is to provide a method of manufacturing a group-III nitride crystal with the growth rate thereof increased.

The present invention provides a method of manufacturing a group-III nitride crystal in which a nitrogen plasma is brought into contact with a melt containing a group-III element and an alkali metal to grow the group-III nitride crystal.

In the method of manufacturing a group-III nitride crystal according to the present invention, a substrate can be placed in the melt to grow the group-III nitride crystal thereon.

Furthermore, in the method of manufacturing a group-III nitride crystal according to the present invention, a minimal distance between a surface of the melt and a surface of the substrate is preferably at most 50 mm.

Furthermore, in the method of manufacturing a group-III nitride crystal according to the present invention, a minimal distance between the surface of the melt and the surface of the substrate is preferably at most 20 mm.

Furthermore, in the method of manufacturing a group-III nitride crystal according to the present invention, the surface of the melt preferably has a higher temperature than a lower portion of the melt.

The present invention also provides a method of manufacturing a group-III nitride crystal in which a substrate is placed in a melt containing a group-III element and an alkali metal to grow the group-III nitride crystal thereon, with a minimal distance between a surface of the melt and a surface of the substrate set to be at most 50 mm.

In the method of manufacturing a group-III nitride crystal according to the present invention, a minimal distance between the surface of the melt and the surface of the substrate is preferably at most 20 mm.

Furthermore, in the method of manufacturing a group-III nitride crystal according to the present invention, the group-III element may be gallium and the alkali metal may be sodium.

Furthermore, in the method of manufacturing a group-III nitride crystal according to the present invention, the melt may contain silicon.

According to the present invention, there can be provided a method of manufacturing a group-III nitride crystal with the growth rate thereof increased.

DESCRIPTION OF THE PREFERRED EMBODIMENTS

Figure 1:
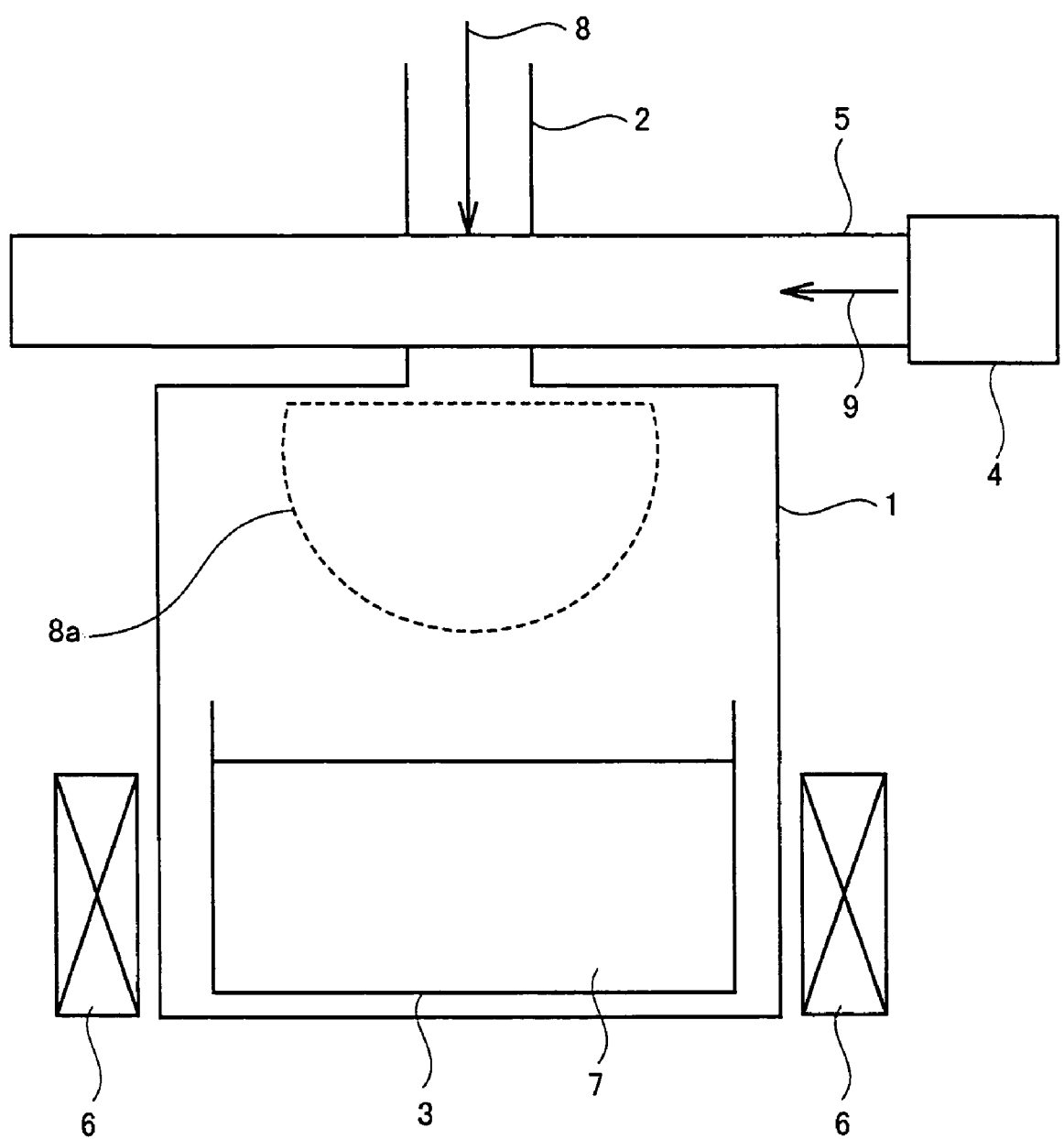
FIG. 1 is a schematic cross section showing part of a preferable example of a manufacturing device used for a method of manufacturing a group-III nitride crystal according to the present invention.

Embodiments of the present invention will be described in the following. It is noted that the same reference characters refer to the same or corresponding parts throughout the drawings.

First Embodiment

FIG. 1 shows a manufacturing device which includes a reaction pipe 1 made of stainless steel, a gas introduction pipe 2 made of quartz and placed on an upper portion of reaction pipe 1, a crucible 3 made of alumina and placed inside reaction pipe 1, an oscillator 4 for generating a microwave, a waveguide 5 made of aluminum and guiding the microwave, and a heating device 6 placed outside reaction pipe 1.

Crucible 3 contains a melt including Ga and Na (Ga—Na melt) 7 obtained by filling crucible 3 with powders of Ga and Na and then heating the same by means of heating device 6.

Reaction pipe 1 is first exhausted by a vacuum pump (not shown) to have an internal pressure thereof of approximately $10^{-2}$ Pa, for example. Through gas introduction pipe 2 placed on the upper portion of reaction pipe 1, a nitrogen gas 8 is then introduced into reaction pipe 1 to have an internal pressure thereof ranging from 100 Pa to 5000 Pa, for example. In doing so, through waveguide 5 provided on the upper portion of reaction pipe 1, a microwave 9 having a frequency of 2.45 GHz and an output of 100 W, for example, is applied to nitrogen gas 8 to generate a nitrogen plasma 8a, which is brought into contact with Ga—Na melt 7 to grow on an inner wall of crucible 3, for example, a GaN crystal, namely, a group-III nitride crystal.

As such in the present embodiment, nitrogen plasma 8a, which is more reactive than nitrogen gas 8 in the form of molecule, is brought into contact with Ga—Na melt 7. Furthermore, since nitrogen plasma 8a has much higher temperature than nitrogen gas 8, a surface of Ga—Na melt 7 has higher temperature than a lower portion thereof, resulting in that a large amount of nitrogen dissolves in the neighborhood of Ga—Na melt 7 surface at higher temperature while a large amount of GaN crystallizes on the lower portion thereof at lower temperature. Furthermore, according to the present embodiment, Na in Ga—Na melt 7 has a catalytic effect, which highly promotes the growth of a GaN crystal. Therefore, the growth rate of a GaN crystal can significantly be increased in the present embodiment.

Furthermore, according to the present embodiment, a GaN crystal grows in the lower portion of Ga—Na melt 7, which covers the grown GaN crystal. Therefore, the GaN crystal is less susceptible to a damage caused by a collision with nitrogen plasma 8a. As a result, quality of a GaN crystal can be improved in the present invention.

Furthermore, according to the present embodiment, reaction pipe 1 is not required to have high internal pressure. Therefore, temperature control of Ga—Na melt 7, pressure control of the inside of reaction pipe 1, introduction of nitrogen gas 8, and others become much easier than the case in which the inside of reaction pipe 1 is set at high internal pressure, and the structure of a manufacturing device can be simplified as well. As a result, the cost of manufacturing a GaN crystal can significantly be reduced.

Furthermore, according to the present embodiment, a heating temperature of heating device 6 is controlled such that the surface of Ga—Na melt 7 is set at higher temperature than the lower portion thereof, and nitrogen plasma 8a is then brought into contact with Ga—Na melt 7. Accordingly, an amount of nitrogen dissolved in Ga—Na melt 7 increases, which tends to enable the growth rate of a GaN crystal to be further increased. Herein, it is preferable to have Ga—Na melt 7 with a monotonically descending temperature gradient from the surface to the lower portion because a GaN crystal of higher quality tends to be obtained easily.

Second Embodiment

Figure 2:
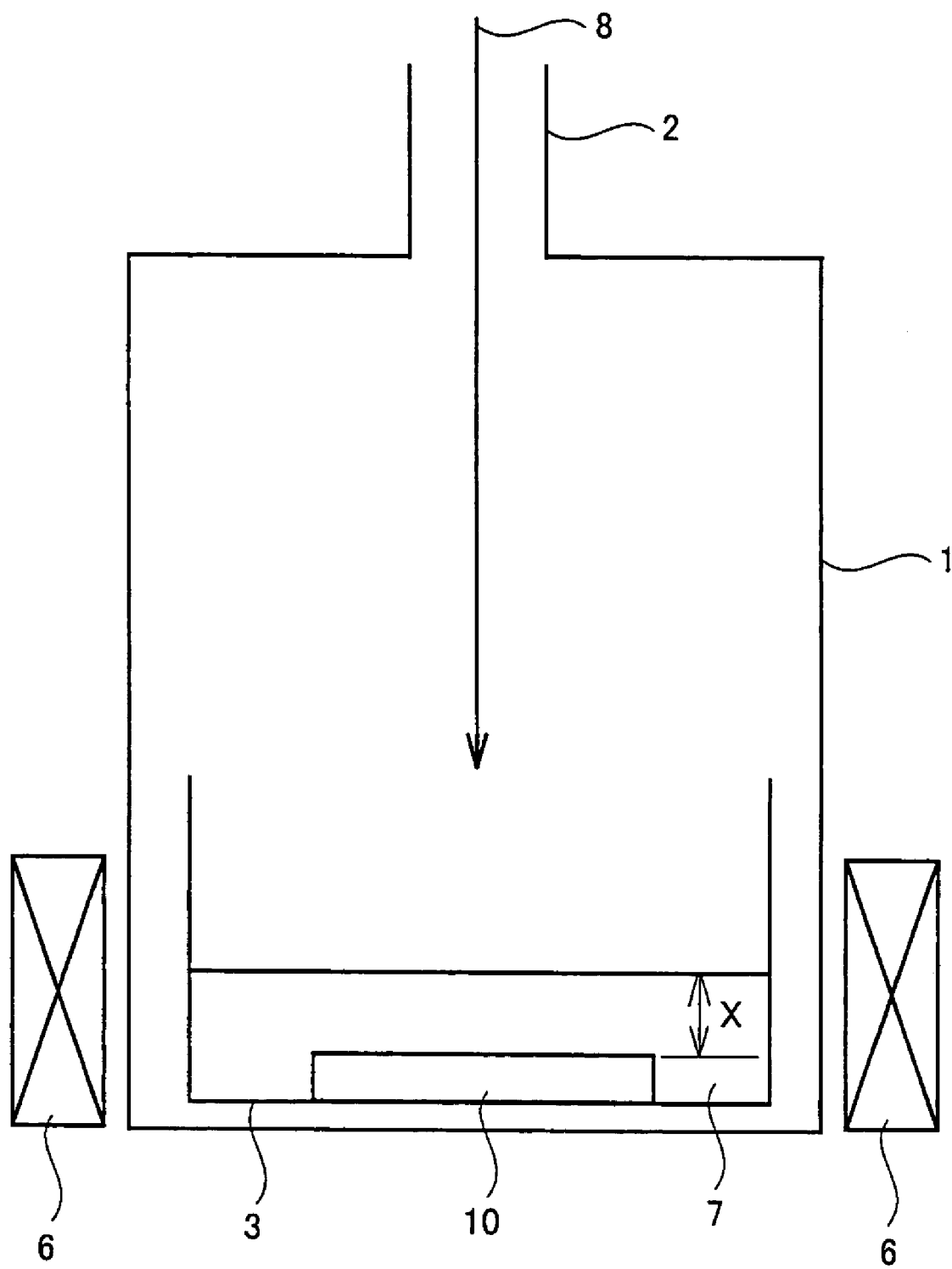
FIG. 2 is a schematic cross section showing part of another preferable example of the manufacturing device used for the method of manufacturing a group-III nitride crystal according to the present invention.

Referring to FIG. 2, the present embodiment is characterized in that a GaN template substrate 10 having a GaN thin film formed on a (0001) surface of a sapphire substrate is placed in Ga—Na melt 7 in the horizontal direction, and then nitrogen gas 8, which is not converted into plasma, is brought into contact with Ga—Na melt 7 to grow on GaN template substrate 10 a GaN crystal, namely, a group-III nitride crystal.

Herein, a minimal distance X between surfaces of Ga—Na melt 7 and GaN template substrate 10 is preferably at most 50 mm, more preferably at most 20 mm. This is because the inventors of the present invention have found that, with minimal distance X therebetween set to be at most 50 mm, contact of nitrogen gas 8 with the surface of Ga—Na melt 7 immediately causes a GaN crystal to grow on GaN template substrate 10, and a GaN crystal is less likely to grow on a wall of crucible 3. The inventors of the present invention have also found that, with minimal distance X of at most 20 mm, the tendency above becomes significant. In this case, the growth rate of a GaN crystal can be increased without forming a temperature gradient for Ga—Na melt 7. This may be because shorter minimal distances X provide a higher and more uniform concentration of nitrogen contained in Ga—Na melt 7 between the surface of Ga—Na melt 7 and GaN template substrate 10.

Furthermore, according to the present embodiment, reaction pipe 1 preferably has an internal pressure ranging from 1 MPa to 10 MPa, both inclusive, more preferably from 3 MPa to 8 MPa, both inclusive. With an internal pressure thereof of less than 1 MPa, nitrogen gas 8 would not dissolve in Ga—Na melt 7 and a GaN crystal would not tend to grow. With an internal pressure thereof exceeding 10 MPa, the growth rate of a GaN crystal would be too high, and more GaN crystals in the form of polycrystal would grow on the wall of crucible 3 when compared to GaN crystals in the form of single crystal growing on GaN template substrate 10. Furthermore, even a GaN crystal growing on GaN template substrate 10 would tend to be polycrystalline. With an internal pressure thereof ranging from 3 MPa to 8 MPa, both inclusive, a GaN crystal of high crystallinity tends to grow efficiently.

Third Embodiment

Figure 3:
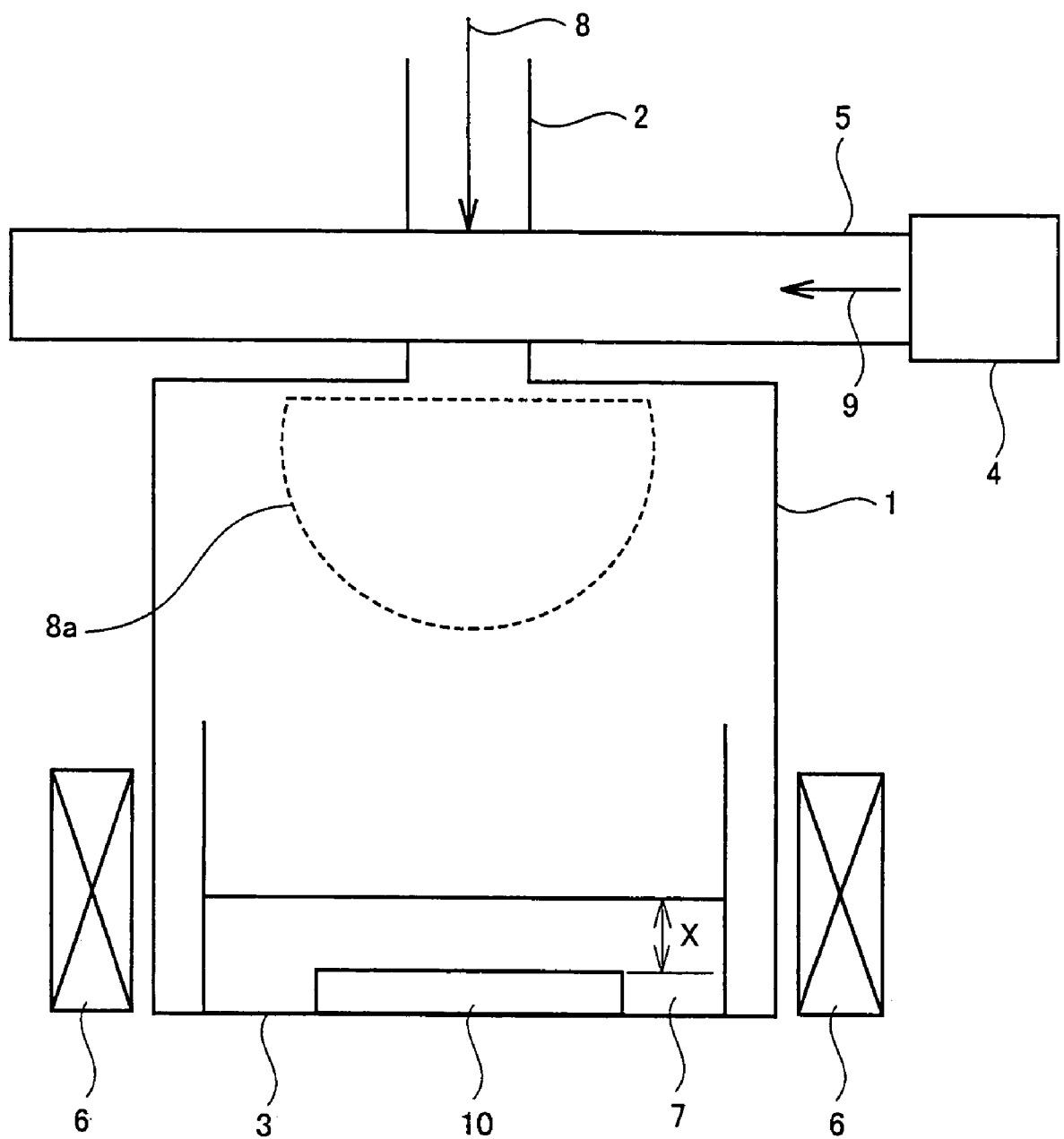
FIG. 3 is a schematic cross section showing part of still another preferable example of the manufacturing device used for the method of manufacturing a group-III nitride crystal according to the present invention.

Referring to FIG. 3, the present embodiment is characterized in that nitrogen gas 8 is converted into nitrogen plasma 8a to be brought into contact with Ga—Na melt 7, and that minimal distance X between the surfaces of Ga—Na melt 7 and GaN template substrate 10 is set to be at most 50 mm, more preferably at most 20 mm.

Therefore, according to the present embodiment, contact of highly reactive nitrogen plasma 8a with the surface of Ga—Na melt 7 immediately causes a GaN crystal to grow on GaN template substrate 10, which can increase the growth rate of a GaN crystal.

Other Embodiments

In the present embodiments above, there has been described a case in which a GaN crystal is grown as a group-III nitride crystal. Alternatively, an aluminum nitride (AlN) crystal or an indium nitride (InN) crystal may also be grown in the present invention.

Furthermore, in the present embodiments above, Ga—Na melt 7 may contain an impurity such as silicon (Si) to manufacture an electrically conductive group-III nitride crystal.

Furthermore, in the present embodiments above, a sapphire substrate or a GaN single crystal substrate may be substituted for GaN template substrate 10.

Furthermore, in the present embodiments above, a radio frequency of 13.56 MHz, for example, may be substituted for the microwave of 2.45 GHz to generate a nitrogen plasma.

Furthermore, in the present embodiments above, an azide of an alkali metal such as sodium azide ($NaN_3$), which is decomposed into an alkali metal and a nitrogen gas at high temperature, may be substituted for Na.

EXAMPLES

Example 1

Crucible 3 shown in FIG. 1 was filled with 20 g of Ga and 15 g of Na, and then heated by means of heating device 6 to produce Ga—Na melt 7. Herein, a heating temperature of heating device 6 was controlled such that the surface and the bottom of Ga—Na melt 7 had temperatures of 900° C. and 800° C., respectively, and that Ga—Na melt 7 had a monotonically descending temperature gradient from the surface to the lower portion. Reaction pipe 1 was then evacuated to have an internal pressure of $10^{-2}$ Pa, and nitrogen gas 8 was introduced through gas introduction pipe 2 into reaction pipe 1 to obtain an internal pressure thereof of 1000 Pa. In doing so, through waveguide 5 provided on the upper portion of reaction pipe 1, microwave 9 having a frequency of 2.45 GHz and an output of 100 W for example was applied to nitrogen gas 8 to generate nitrogen plasma 8a. Nitrogen plasma 8a was then brought into contact with Ga—Na melt 7 to grow on the bottom of crucible 3 a GaN crystal, whose growth rate is shown in Table 1. After 100 hours, the GaN crystals were grown across the bottom of crucible 3 to have a thickness of approximately 2 mm. Therefore, the growth rate of the GaN crystal in Example 1 was 20 µm/hour as shown in Table 1.

Example 2

A GaN template substrate 10, which had a GaN thin film with a thickness of 3 µm formed on a (0001) surface of a sapphire substrate with a width of 10 mm, a length of 10 mm, and a thickness of 0.4 mm by an organic metal vapor deposition method, was placed in the horizontal direction in crucible 3 shown in FIG. 3. Herein, the mole ratio of Ga to Na in Ga—Na melt 7 was the same as Example 1. As in Example 1, a GaN crystal was then grown except that minimal distance X between the surfaces of Ga—Na melt 7 and flat GaN template substrate 10 was set to be 55 mm and the GaN crystal was grown on GaN template substrate 10. Table 1 shows a growth rate of the GaN crystal in Example 2, which is 25 µm/hour. Since GaN template substrate 10 was placed in the horizontal direction, GaN crystals uniform in thickness were grown on the surface thereof.

Example 3

Ga—Na melt 7, having the same mole ratio of Ga to Na as Example 1, was produced. As in Example 2, a GaN crystal was then grown on GaN template substrate 10 except that minimal distance X between the surfaces of Ga—Na melt 7 and flat GaN template substrate 1 was set to be 50 mm. Table 1 shows the growth rate of the GaN crystal in Example 3, which is 45 µm/hour.

Example 4

Ga—Na melt 7, having the same mole ratio of Ga to Na as Example 1, was produced. As in Example 2, a GaN crystal was then grown on GaN template substrate 10 except that minimal distance X between the surfaces of Ga—Na melt 7 and flat GaN template substrate 10 was set to be 20 mm. Table 1 shows the growth rate of the GaN crystal in Example 4, which is 60 µm/hour.

Comparative Example 1

As in Example 1, a GaN crystal was grown on an inner wall of crucible 3 except that a Ga melt was produced without filling with Na crucible 3 shown in FIG. 1 and nitrogen plasma 8a was brought into contact with a surface of the Ga melt. Table 1 shows the growth rate of the GaN crystal in Comparative Example 1, which is 12 µm/hour.

TABLE 1

| | nitrogen supply | melt | pressure (Pa) | substrate | minimal distance X between surfaces of melt and substrate | growth rate of GaN crystal (µm/hour) |
|---|---|---|---|---|---|---|
| Example 1 | nitrogen plasma | Ga-Na melt | 1000 | not used | — | 20 |
| Example 2 | nitrogen plasma | Ga-Na melt | 1000 | used | 55 mm | 25 |
| Example 3 | nitrogen plasma | Ga-Na melt | 1000 | used | 50 mm | 45 |
| Example 4 | nitrogen plasma | Ga-Na melt | 1000 | used | 20 mm | 60 |
| Comparative Example 1 | nitrogen plasma | Ga melt | 1000 | not used | — | 12 |

As shown in Table 1, the growth rates of the GaN crystal in Examples 1 to 4 were higher than that of Comparative Example 1.

Furthermore, Examples 3 and 4, in which minimal distances X between the surfaces of Ga—Na melt 7 and GaN template substrate 10 were 50 mm and 20 mm, respectively, had higher growth rates of a GaN crystal than Example 2, in which minimal distance X was 55 mm.

Furthermore, Example 4, in which minimal distance X was 20 mm, had higher growth rate of a GaN crystal than Example 3, in which minimal distance X was 50 mm.

Example 5

As in Example 3, a GaN crystal was grown on flat GaN template substrate 10 except that nitrogen gas 8 was brought into contact with Ga—Na melt 7 by means of the manufacturing device shown in FIG. 2 with an internal pressure of reaction pipe 1 set at 5 MPa. Table 2 shows the growth rate of the GaN crystal in Example 5, which is 7 µm/hour.

Example 6

As in Example 5, a GaN crystal was grown on flat GaN template substrate 10 except that minimal distance X between the surfaces of Ga—Na melt 7 and GaN template substrate 10 was set to be 20 mm. Table 2 shows the growth rate of the GaN crystal in Example 6, which is 15 µm/hour.

Comparative Example 2

As in Example 5, a GaN crystal was grown on GaN template substrate 10 except that minimal distance X between the surfaces of Ga—Na melt 7 and flat GaN template substrate 10 was set to be 55 mm. Table 2 shows the growth rate of the GaN crystal in Comparative Example 2, which is 1 µm/hour.

Comparative Example 3

An attempt was made to grow a GaN crystal on GaN template substrate 10 as in Example 5 except that the internal pressure of reaction pipe 1 was set at 1000 Pa ($10^{-3}$ MPa). However, due to the low pressure of 1000 Pa, nitrogen gas 8 did not dissolve in Ga—Na melt 7, resulting in a failure of GaN crystal growth. Therefore, as shown in Table 2, the growth rate of the GaN crystal in Comparative Example 3 is 0 µm/hour.

TABLE 2

| | nitrogen supply | melt | pressure (MPa) | substrate | minimal distance X between surfaces of melt and substrate | growth rate of GaN crystal (µm/hour) |
|---|---|---|---|---|---|---|
| Example 5 | nitrogen gas | Ga-Na melt | 5 | used | 50 mm | 7 |
| Example 6 | nitrogen gas | Ga-Na melt | 5 | used | 20 mm | 15 |
| Comparative Example 2 | nitrogen gas | Ga-Na melt | 5 | used | 55 mm | 1 |
| Comparative Example 3 | nitrogen gas | Ga-Na melt | $10^{-3}$ | used | 50 mm | 0 |

As shown in Table 2, Examples 5 and 6, in which minimal distances X were 50 mm and 20 mm, respectively, had higher growth rates of a GaN crystal than Comparative Example 2, in which minimal distance X was 55 mm.

Furthermore, Example 6, in which minimal distance X was 20 mm, had higher growth rate of a GaN crystal than Example 5, in which minimal distance X was 50 mm.

Example 7

As in Example 4, a GaN crystal was grown on flat GaN template substrate 10 except that crucible 3 shown in FIG. 3 was filled with 0.02 g of Si along with Ga and Na to produce Ga—Na melt 7.

When the GaN crystal was evaluated with a Hall measurement in van der Pauw method, it exhibited n-type conduction and had a carrier concentration of $3.1 \times 10^{18}/cm^3$, an electron mobility of 60 $cm^2/Vs$, and a specific resistance value of 0.03 Ω·cm.

Example 8

As in Example 6, a GaN crystal was grown on flat GaN template substrate 10 except that crucible 3 shown in FIG. 2 was filled with 0.02 g of Si along with Ga and Na to produce Ga—Na melt 7.

When the GaN crystal was evaluated with the Hall measurement in the van der Pauw method, it exhibited n-type conduction and had a carrier concentration of $2.2 \times 10^{18}/cm^3$, an electron mobility of 80 $cm^2/Vs$, and a specific resistance value of 0.04 Ω·cm.

According to the present invention, there can be provided a method of manufacturing a group-III nitride crystal with the growth rate thereof increased. Therefore, the present invention is suitably utilized in the fields of optical devices and electronic devices using the group-III nitride crystal.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a group-III nitride crystal, wherein the group-III nitride crystal is grown on a substrate placed in a melt containing a group-III element and an alkali metal, with a minimal distance between a surface of said melt and a surface of said substrate set to be at most 50 mm.

2. The method of manufacturing a group-III nitride crystal according to claim 1, wherein the minimal distance between the surface of said melt and the surface of said substrate is at most 20 mm.

3. The method of manufacturing a group-III nitride crystal according to claim 1, wherein said group-III element is gallium and said alkali metal is sodium.

4. The method of manufacturing a group-III nitride crystal according to claim 1, wherein said melt contains silicon.

5. A method of manufacturing a group-III nitride crystal, comprising placing a substrate into a melt containing a group-III element and an alkali metal such that a minimum distance between a surface of said melt and a surface of said substrate is at most 50 mm, and bringing a nitrogen plasma into contact with said melt, so as to grow said group-III nitride crystal on said substrate in a said melt.

6. The method of manufacturing a group-III nitride crystal according to claim 5, wherein said minimum distance between said surface of said melt and said surface of said substrate is at most 20 mm.

7. The method of manufacturing a group-III nitride crystal according to claim 5, wherein said surface of said melt has a higher temperature than a deeper portion of said melt.

8. The method of manufacturing a group-III nitride crystal according to claim 5, wherein said group-III element is gallium and said alkali metal is sodium.

9. The method of manufacturing a group-III nitride crystal according to claim 5, wherein said melt contains silicon.

* * * * *